(12) United States Patent
Pichulo et al.

(10) Patent No.: US 6,303,008 B1
(45) Date of Patent: Oct. 16, 2001

(54) ROTATING FILM CARRIER AND APERTURE FOR PRECISION DEPOSITION OF SPUTTERED ALLOY FILMS

(75) Inventors: Robert O. Pichulo, Flint; Gregory Keller Rasmussen, Grand Blanc; Mark Ray McClanahan, Goodrich, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/667,757

(22) Filed: Sep. 21, 2000

(51) Int. Cl.[7] .................................................... C23C 14/34
(52) U.S. Cl. .............................. 204/192.15; 204/192.12; 204/298.11; 204/298.19; 204/298.23; 204/298.27; 204/298.28; 204/298.29
(58) Field of Search ...................... 204/192.12, 192.15, 204/192.17, 298.11, 298.19, 298.23, 298.27, 298.28, 298.29

(56) References Cited

U.S. PATENT DOCUMENTS

| | | | |
|---|---|---|---|
| 4,824,481 | 4/1989 | Chatterjee et al. | 75/246 |
| 5,061,914 | 10/1991 | Busch et al. | 337/140 |
| 5,108,523 | 4/1992 | Peterseim et al. | 148/402 |
| 5,114,504 | 5/1992 | AbuJudom, II et al. | 148/402 |
| 5,114,556 | * 5/1992 | Lamont, Jr. | 204/192.12 |
| 6,033,536 | 3/2000 | Ichihara et al. | 204/192.2 |
| 6,045,671 | * 4/2000 | Wu et al. | 204/298.11 |

FOREIGN PATENT DOCUMENTS

141685 * 5/1980 (DE) .................. 204/298.29

OTHER PUBLICATIONS

K. Nomura, S. Miyazaki and A. Ishida, "Effect of Plastic Strain on Shape Memory Characteristics in Sputter–Deposited Ti–Ni Thin Films", Journal De Physique IV, Colloque C8, supplement au Journal de Physique III, vol. 5, Dec. 1995, pp. C8–695 to C8–700.

A. Ishida, M. Sato, A. Takei, K. Nomura, and S. Miyazaki, "Effect of Aging on Shape Memory Behavior of Ti–51.3 At. Pct Ni Thin Films", Metallurgical and Materials Transactions A, vol. 27A, Dec. 1996, pp. 3753–3759.

(List continued on next page.)

Primary Examiner—Rodney G. McDonald
(74) Attorney, Agent, or Firm—John A. Vanophem

(57) ABSTRACT

A method and system for producing thin film alloy by a sputtering deposition process comprising using a circle-shaped aperture interposed between the target and substrate of a sputtering deposition system and establishing a rotating/oscillating relationship between the substrate and the aperture.

12 Claims, 1 Drawing Sheet

OTHER PUBLICATIONS

S. Miyazaki and K. Nomura, "Development of Perfect Shape Memory Effect in Sputter–Deposited Ti–Ni Thin Films", Proc. IEEE Micro Electro Mechanical Systems (MEMS–94), Oiso, Japan, (1994), pp. 176–181.

Akira Ishida, Morio Sato, Atsushi Takei, and Shuichi Miyazaki, "Effect of Heat Treatment on Shape Memory Behavior of Ti–rich Ti–Ni Thin Films", Materials Transactions, JIM, vol. 36, No. 11 (1995), pp. 1349–1355.

S.A. Mathews, Manfred Wutting, and Quanmin Su, "The Effect of Substrate Constraint on the Martensitic Transformation of Ni–Ti Thin Films", Metallurgical and Materials Transactions A, vol. 27A, Sep. 1996, pp. 2859 to 2861.

X. D. Han, W. H. Zou, R. Wang, Z. Zhang, D. Z. Yang, and K. H. Wu, "The Martensite Structure and Aging Precipitates of a TiNiHf High Temperature Shape Memory Alloy", Journal De Physique IV, Colloque C8, supplement au Journal de Physique III, vol. 5, Dec. 1995, pp. C8–753 to C8–758.

D. S. Grummon and T. J. Pence, "Thermotractive Titanium–Nickel Thin Films For Microelectromechanical Systems And Active Composites", Mat. Res. Soc. Symp. Proc. vol. 459 © 1997 Materials Research Society, pp. 331–343.

D. S. Grummon, Li Hou, Z. Zhao, and T.J. Pence, "Progress on Sputter–Deposited Thermotractive Titanium–Nickel Films", Journal De Physique IV, Colloque C8, supplement au Journal de Physique III, vol. 5, Dec. 1995, pp. C8–665 to C8–670.

A.D. Johnson, V. V. Martynov, and R. S. Minners, "Sputter Deposition of High Transition Temperature Ti–Ni–Hf Alloy Thin Films", Journal De Physique IV, Colloque C8, supplement au Journal de Physique III, vol. 5, Dec. 1995, pp. C8–783 to C8–801.

P. Frach, K. Goedicke, T. Winkler, Chr. Gottfried, H. Walde, W. Hentsch, "Advantageous possibilities, design aspects and technical use of double–ring magnetron sputter sources", Surfaces and Coatings Technology vol. 74–75 (1995) 85–91.

* cited by examiner

ROTATING FILM CARRIER AND APERTURE FOR PRECISION DEPOSITION OF SPUTTERED ALLOY FILMS

TECHNICAL FIELD

This invention relates to a system for producing thin film alloys by sputtering process techniques. In particular, it relates to a system for producing NiTi shape memory alloy films wherein uniform composition of the deposited films is controlled through use of an aperture interposed between the target and substrate of a sputtering deposition system, and maintaining a rotating/oscillating relationship between the substrate and the aperture.

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These shape-memory alloy ("SMA") materials, if plastically deformed while cool, will revert, exerting considerable force, to their original, undeformed shape when warmed. These energetic phase transformation properties render articles made from these alloys highly useful in a variety of applications. An article made of an alloy having shape-memory properties can be deformed at a low temperature from its original configuration, but the article "remembers" its original shape, and returns to that shape when heated.

For example, in nickel-titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the NiTi alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

SMA materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in size and usefulness.

The unique properties of SMA's further have been adapted to microelectromechanical systems ("MEMS") applications such as micro-valves and micro-actuators by means of thin film technology. Micro-actuators are desirable for such utilities as opening and closing valves, activating switches, and generally providing motion for micro-mechanical devices. The most well-known and most readily available SMA is an alloy of nickel and titanium. NiTi SMA has been extensively investigated as one of the most promising materials for MEMS such as microvalves and micro-actuators. NiTi SMA features the major advantages of having a large output force per unit volume, and the capability to serve as structural components as well as active components. It is reported that the advantageous performance of micro-actuators is attributed to the fact that the shape-memory effect of the stress and strain can produce substantial work per unit of volume. For example, the work output of nickel-titanium shape-memory alloy is of the order of 1 joule per gram per cycle. A shape-memory film micro-actuator measuring one square millimeter and ten microns thick is estimated to exert about 64 microjoules of work per cycle. With a temperature change of as little as about 10° C., this alloy can exert a force of as much as 415 MPa when applied against a resistance to changing its shape from its deformation state.

Previous processes involving MEMS have involved two fabrication techniques: machining of bulk SMA sheets or wires and deposition of SMA films from a NiTi alloy target. Unfortunately, these processes feature miniaturization and productivity limitations. Machining and assembly for MEMS devices using bulk SMA materials restricts manufacturing object size such as thickness of sheet and diameter of wire. Deposition processes have the potential of miniaturization and mass production. Deposition of a sputtered flux from a multicomponent target has been practiced for the growth of thin alloy films of a desired composition. It is known, however, that the composition of the sputtered flux varies with the polar angle of ejection from the target because of the different angular distributions of the individual target constituents. Conventional sputter deposition systems typically include a vacuum enclosure forming a sputter deposition chamber in which a circular sputter target is mounted facing opposite a wafer substrate surface. A magnetron cathode source, with means for producing a magnetic field, is set behind the circular target material. After the sputter deposition chamber has been pumped out to create a vacuum therein to the order of $10^{-5}$ Pa, a sputter process gas, such as argon, is fed into the chamber and held at a fixed process pressure. The magnetron cathode generally features a center magnet and an annular magnet surrounding the outer circumferential edge of the center magnet, which develops a magnetic field across the circular target. When voltage is applied, a discharge occurs between the target and the substrate and the target material undergoes a sputtering action and a film made of the target material is deposited on the substrate. An annular erosion region is formed in circular target, caused by rotation of the magnetic field during sputter deposition. In a typica NiTi target deposition process, small Ti plates are put on the top of the target for adjustment of the deposited composition of NiTi SMA films. The deposited film composition is controlled mainly by adjusting the number of plates. This method requires considerable expertise to determine the number, size, geometry, and position of plates, and considerable handwork to set up the apparatus.

Phase transition temperatures and thermo-mechanical properties of SMA's, such as NiTi, are extremely sensitive to compositional makeup. A small change in composition from stoichiometric NiTi causes a large change of the transformation temperature. A transformation temperature difference as large as 100°K can result from a variation in stoichiometric Ni of only 1.0 at %, and any redundant Ti could substantially degrade the mechanical properties of the SMA material. Precise, flexible and simple compositional control is required for effective and efficient SMA film production. Accordingly, inability to adjust the composition of the films easily and precisely has thwarted practical utility of this material in many MEMS applications.

To ensure consistent transition temperatures and favorable shape-memory effect (SME) properties, composition control is the key. In NiTi thin film fabrication processing by sputtering, the first source of composition variation of thin film is from target. Therefore, target composition has to be closely controlled. To minimize oxygen contamination, typically, sputtering targets for shape-memory alloy films are fabricated using alloy process techniques involving numerous steps including melting, remelting, solidification, and even long-time homogenization treatment. Because very high temperature has to be used, these procedures often result in the preferential loss of one or more elements to the others, and the compositional control becomes very difficult. Along with high cost and long processing time, the difficulty in compositional control makes this target-making process very impractical, especially when making large size targets.

A homogenous target for sputtering deposition also is taught to be accomplished by using hot pressing powder metallurgy techniques. In addition to quicker and easier fabrication, and significantly facilitated compositional control, it further has been found that shape-memory alloy thin films produced by sputtering using such hot pressed targets exhibit good mechanical properties and SME, as well as widely ranged phase transition temperatures.

However, even with pressed powder sputter targets, precise compositional control of the blended components is still difficult and inconsistent, due to imperfect mixing of the constituent elements that comprise the target.

SUMMARY OF THE INVENTION

Now, an improved sputtering deposition system for forming an alloy film has been developed, whereby the compositional makeup of the resultant alloy film produced, effectively can be controlled.

According to the present invention, it is recognized that a sputtering deposition process is a divergent beam technology. In order to ensure precision control over the parameters of the deposited film, it is required to make supplemental tuning adjustments, collimation, as well as focusing of the sputtered beam. The present invention comprises an aperture that is interposed between the target of a sputtering deposition system and the substrate onto which a film is deposited. The circular symmetry of the planar cathode and magnetron assembly of a sputter deposition system produces fluxes of target component atoms in proportions which change only with radial position on the substrate and not with azimuth. Now, according to the present invention, it has been determined that it is a consequence of the axial symmetry of the sputtering geometry that when a mask fashioned with a narrow circular aperture is interposed co-axially between the substrate and cathode, any flux reaching the substrate is constrained to pass through the aperture of fixed radius thereby producing film of fixed composition. When the substrate is a sufficiently small fraction of the target diameter, and the target-to-substrate distance is optimized, the depositional flux is nearly uniform over the substrate. In this case simple oscillatory motion of the substrate beneath the aperture suffices to ensure uniform film coverage. When the substrate grows to a large fraction of the target diameter the depositional flux weakens towards the substrate outer edge and oscillatory motion alone can no longer ensure thickness uniformity. Rotation of the substrate in combination with oscillatory motion enhances accumulation near the outer edges in such a manner as to offset the diminished depositional flux. It was determined that it is readily shown that a rotating/oscillatory movement relationship between the substrate and the stationary mask will ensure that all parts of the substrate are coated with film of the same composition. Therefore, pursuant to the present invention, a circle-shaped aperture is interposed between the target and substrate, and, in addition, an oscillating, or preferably a rotating/oscillating relationship is established between the substrate and said aperture. In this manner, a fine compositional control and uniformity of thin films produced by sputtering deposition can be accomplished.

The invention can be employed for deposition of a film of any alloy by sputter deposition. Specifically, however, it is useful for deposition of alloys whose properties are sensitive to even slight compositional variation. In particular, the invention is applicable to deposition of shape memory alloys, such as NiTi shape memory alloys.

BRIEF DESCRIPTION OF THE DRAWINGS

The above discussed and other features and advantages of the present invention will be appreciated and understood by those skilled in the art from the following detailed description and drawings, wherein like elements are designated by like numerals in the several figures.

Referring now to the drawings.

DESCRIPTION OF A PREFERRED EMBODIMENT

Figure 1:
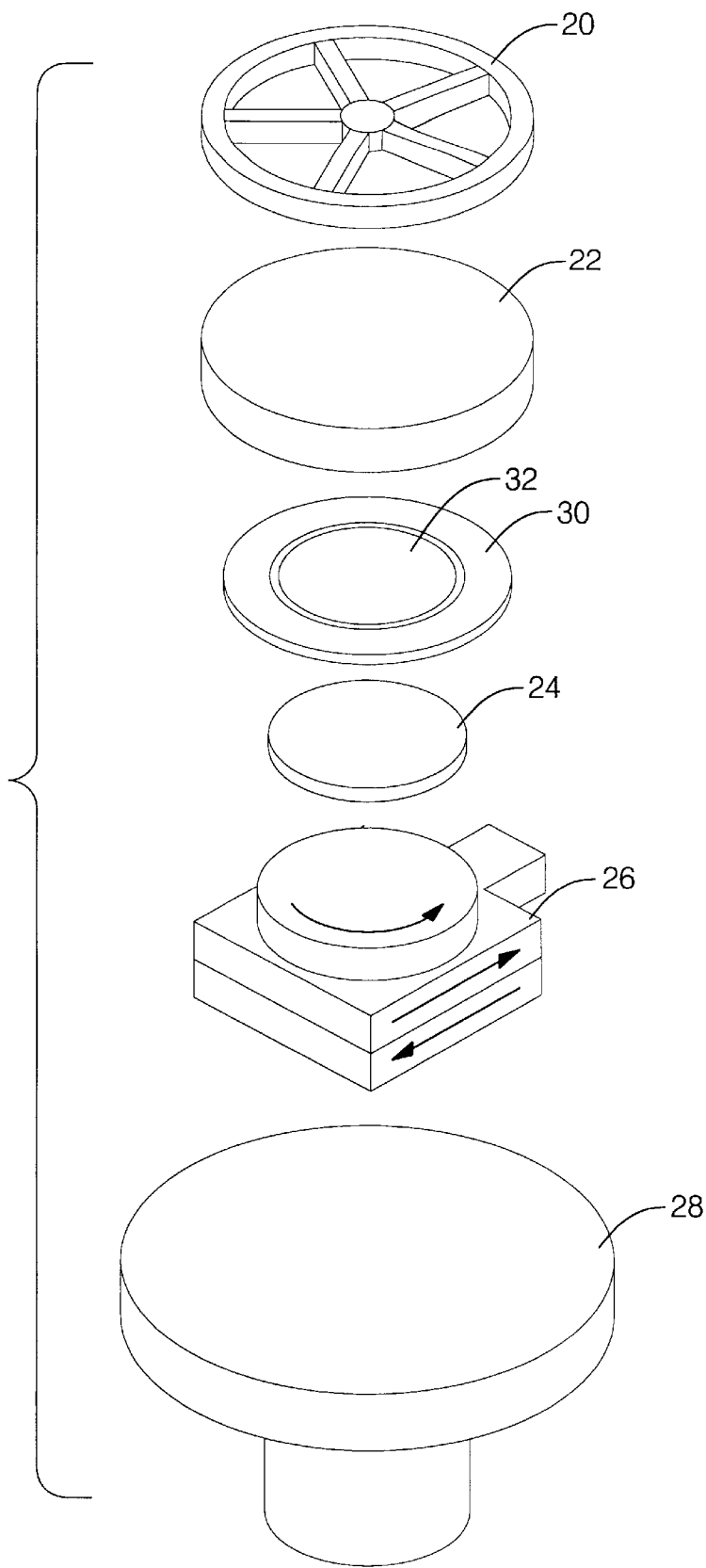
FIG. 1 is an exploded schematic depicting arrangement of components of a sputter deposition system pursuant to the present invention.

An exploded view of the components of a sputter deposition system of the present invention is illustrated in FIG. 1. In operation, the components are contained within a vacuum enclosure forming a sputter deposition chamber (not shown). A circular planar magnetron cathode source assembly 20 is positioned in alignment with and behind a circular target 22, which preferably comprises homogeneous multicomponent nickel and titanium containing material. A substrate 24 typically comprising a wafer of silicon or other suitable material, is set opposite target 22. The substrate 24 is mounted on a rotating/oscillating stage 26 which rotates and slides in oscillating fashion across fixed platen 28. Between target 22 and substrate 24, a mask 30 featuring a circle-shaped aperture 32 is interposed.

After the sputter deposition chamber is pumped out to create a vacuum therein to the order of about $10^{-5}$ Pa, a sputter process gas, such as argon, is introduced into the chamber and held at a fixed pressure. Under an accelerating voltage applied between the platen 28 and the magnetron cathode assembly 20, a discharge occurs between the target 22 and the substrate 24. The rotation of the magnetic field of the circular annular magnet of the magnetron assembly 20 deflects the ions of the created plasma in such a way as to cause the ions to impact the cathode in a circular ring from which target atoms are ejected as a sputtered flux. A metallic film consisting of the components of the target 22 material is caused to be accumulated on substrate 24. However, the sputtered flux only can reach the substrate 24 by passing through the circle-shaped aperture 32 of mask 30. The composition of the deposited film on substrate 24 is dependent only upon the radius and width of the circular slit of the aperture 32. In order to ensure that all areas of the substrate 24 are coated with the same composition, substrate 24 is mounted on stage 26 which rotates and oscillates in relation to the mask 30. Since the composition of the flux passing through the slit of the circle-shaped aperture 32 is constant and the movement of the substrate ensures that all of the substrate is coated with film of the same composition, the resulting film deposited on the substrate surface achieves good compositional uniformity.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

We claim:

1. A system for forming a thin film deposit of an alloy on a substrate by using a sputtering deposition process comprising:

a deposition chamber having a vacuum enclosure;

a means for evacuating the vacuum enclosure;

a magnetron cathode;

a target mounted on the magnetron cathode and having a surface facing into the interior of the vacuum enclosure; and, a substrate positioned within the vacuum enclosure opposite the target surface;

wherein a circular slit aperture of a mask is interposed coaxially between said target and said substrate, and an oscillating relationship is established between said substrate and said aperture and wherein said circular slit aperture is defined by a width and a radius between edges of inner and outer components of the mask.

2. The system of claim 1 wherein an oscillating and rotating relationship is established between said substrate and said aperture.

3. The system of claim 2 wherein the substrate is arranged to rotate and oscillate in relation to an aperture of fixed radius.

4. A method of forming a thin film deposit of an alloy on a substrate by a sputtering deposition process comprising:

establishing an oscillating relationship between a target of a sputtering deposition system and a substrate positioned opposite said target; and coaxially positioning a mask having a circular slit aperture between the target and the substrate so as to control exposure of the substrate to fluxes emanating from the target and passing through said aperture and wherein said circular slit aperture is defined by a width and a radius between edges of inner and outer components of the mask.

5. The method of claim 4 comprising establishing a rotating and oscillating relationship between the target and the substrate.

6. The method of claim 5 wherein the substrate is rotated and oscillated in relation to said aperture.

7. The method of claim 6 comprising adjusting the fixed opening of said aperture in order to control the alloy composition of a film deposited on said substrate.

8. The method of claim 4 wherein a shape memory alloy is deposited.

9. The method of claim 8 wherein a NiTi shape memory alloy is deposited.

10. The method of claim 4 wherein the aperture is a fixed radius circular aperture.

11. A method of forming a thin film deposit of a shape memory alloy on a substrate by a sputtering deposition process comprising:

establishing a rotating and oscillating relationship between a target of a sputtering deposition system and a substrate positioned opposite said target; and coaxially positioning a mask having a circular slit aperture of fixed radius between the target and the substrate so as to control exposure of the substrate to fluxes emanating from the target and passing through said aperture and wherein said circular slit aperture is defined by a width and a radius between edges of inner and outer components of the mask.

12. The method of claim 11 wherein a NiTi shape memory alloy is deposited.

* * * * *